United States Patent
Isano et al.

(10) Patent No.: US 8,309,176 B2
(45) Date of Patent: Nov. 13, 2012

(54) MANUFACTURING METHOD OF THREE-DIMENSIONAL STRUCTURE

(75) Inventors: Taisuke Isano, Utsunomiya (JP);
Kosuke Asano, Utsunomiya (JP);
Yasushi Kaneda, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 570 days.

(21) Appl. No.: 12/478,298

(22) Filed: Jun. 4, 2009

(65) Prior Publication Data

US 2009/0304928 A1   Dec. 10, 2009

(30) Foreign Application Priority Data

Jun. 9, 2008   (JP) ................. 2008-150482

(51) Int. Cl.
| | |
|---|---|
| B32B 38/00 | (2006.01) |
| B32B 38/10 | (2006.01) |
| B32B 37/00 | (2006.01) |
| B32B 37/02 | (2006.01) |
| B05D 1/32 | (2006.01) |
| B05D 1/36 | (2006.01) |
| B05D 1/38 | (2006.01) |
| B05D 5/00 | (2006.01) |

(52) U.S. Cl. ........ 427/259; 427/258; 427/261; 427/265; 427/270; 427/271; 427/272; 427/276; 427/266; 427/282; 427/287

(58) Field of Classification Search ............. 156/155
See application file for complete search history.

(56) References Cited

U.S. PATENT DOCUMENTS 4,662,746 A   5/1987   Hornbeck
2007/0201135 A1 *   8/2007   Sakamoto et al. ............ 359/486

* cited by examiner

*Primary Examiner* — Nathan Empie
*Assistant Examiner* — Lisha Jiang
(74) *Attorney, Agent, or Firm* — Canon USA Inc. IP Division

(57) ABSTRACT

A method for manufacturing a three-dimensional structure includes forming a first structure having a relief pattern on a substrate, forming a sacrifice layer on the first structure such that the sacrifice layer can be filled in a concave part of the first structure and the sacrifice layer can cover a surface of a convex part of the first structure on a side opposite to the substrate, forming a second structure having a relief pattern on the sacrifice layer, and a fourth step of removing the sacrifice layer from between the first structure and the second structure, and thereby bringing the second structure into contact with the surface of the first structure.

6 Claims, 8 Drawing Sheets

MANUFACTURING METHOD OF THREE-DIMENSIONAL STRUCTURE

BACKGROUND OF THE INVENTION

1. Field of the Invention

The present invention relates to a manufacturing method of a three-dimensional structure.

2. Description of the Related Art

Recently, there is a demand for easy and precise manufacture of a three-dimensional structure in a micro electro mechanical system ("MEMS") structure and a sub-wavelength structure ("SWS"). A method of using a sacrifice layer (U.S. Pat. No. 4,662,746) and a wafer fusing method are known as conventional three-dimensional structure manufacturing methods.

The method of using the sacrifice layer coats and hardens a sacrifice layer after a first structure having a relief pattern is formed on a substrate. The sacrifice layer is filled in a concave part of the first structure, and is applied so as to cover the surface of the convex part of the first structure. Next follows polishing, such as chemical mechanical polishing ("CMP") so as to expose the surface of the first structure. Next, a second structure is layered on the first structure in which the concave part is filled with the sacrifice layer, and the sacrifice layer is removed by a dry process. Thereby, a three-dimensional structure in which the first structure and the second structure are sequentially formed on the substrate.

The wafer fusing method prepares two first structures each having a relief pattern on a substrate or a first structure formed on a substrate and a second structure formed on a substrate. Next, this method hydrophilic-processes, superposes, and heats surfaces of concave parts of these two structures so as to fuse the patterns, and next finally removes the substrate on one side. Thereby, a three-dimensional structure can be obtained as in the method of using the sacrifice layer.

However, the polishing step in the method of U.S. Pat. No. 4,662,746 increases the number of steps and thus the cost. In addition, a polishing amount is different between a top of the concave part and a top of the convex part of the first structure, and thus the in-plane uniformity deteriorates and the yield may lower. Moreover, the three-dimensional structure manufacturing method using the wafer fusing method requires highly precise positioning, needs a long time to remove the substrate on one side, and causes a low productivity because processing of a large area is difficult.

SUMMARY OF THE INVENTION

The present invention provides a method for precisely and easily manufacturing a three-dimensional structure.

A method according to one aspect of the present invention for manufacturing a three-dimensional structure includes forming a first structure having a relief pattern on a substrate, forming a sacrifice layer on the first structure such that the sacrifice layer can be filled in a concave part of the first structure and the sacrifice layer can cover a surface of a convex part of the first structure on a side opposite to the substrate, forming a second structure having a relief pattern on the sacrifice layer, and removing the sacrifice layer from between the first structure and the second structure, and thereby bringing the second structure into contact with the surface of the first structure.

Further features of the present invention will become apparent from the following description of exemplary embodiments (with reference to the attached drawings).

DESCRIPTION OF THE EMBODIMENTS

Figure 1:
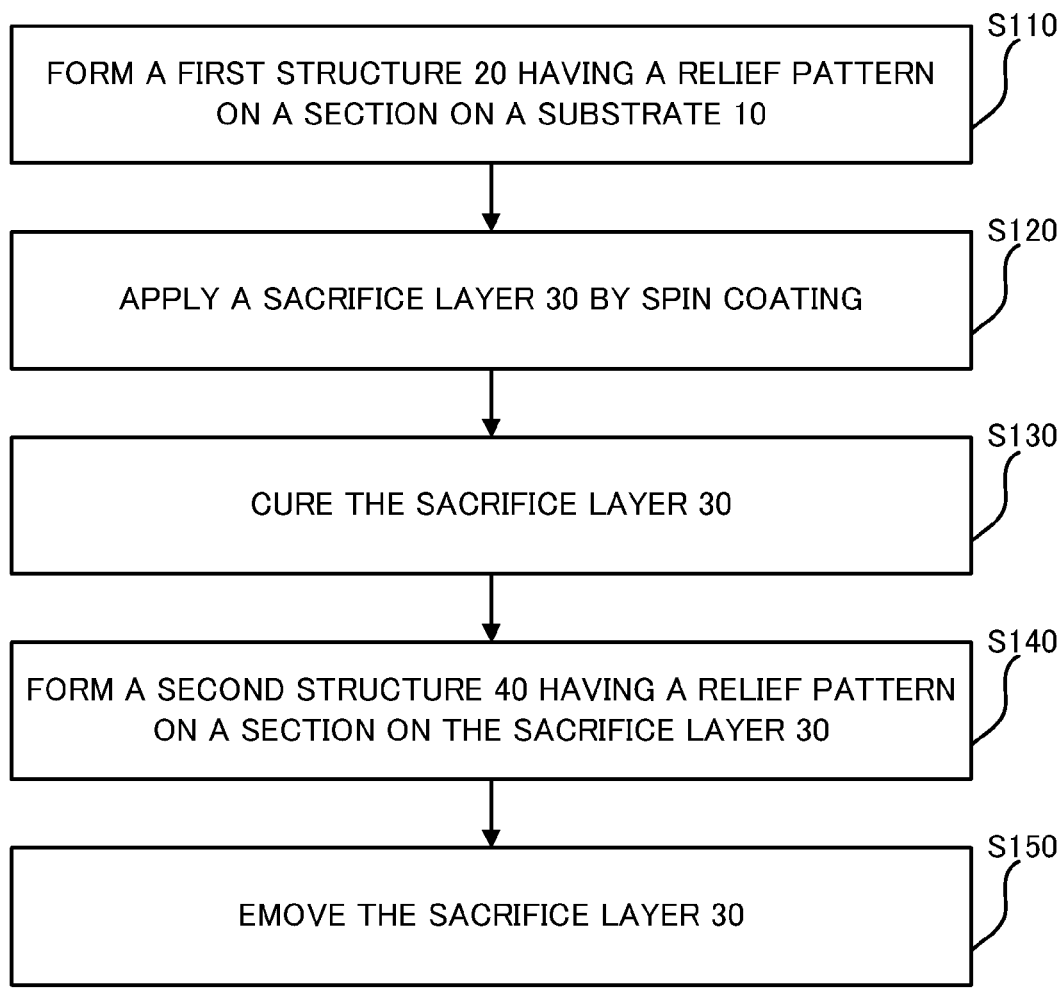
FIG. 1 is a flowchart for explaining a manufacturing method of a three-dimensional structure.

FIG. 1 is a flowchart for explaining a manufacturing method of a three-dimensional structure. In FIG. 1, "S" means a step. FIGS. 2A-2D are views of each step in the manufacturing method shown in FIG. 1.

Figure 2A:
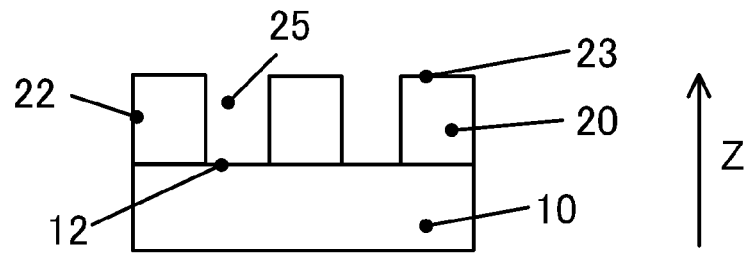
FIGS. 2A-2D are views of each step in the manufacturing method shown in FIG. 1.

Initially, a first structure 20 having a relief pattern is formed on a substrate 10 (S110). FIG. 2A is a sectional view showing this state. Z denotes a (layering) direction that is opposite to the gravity direction, is perpendicular to a surface 12 of the substrate 10, and separates from the substrate 10. The first structure 20 is formed on a top surface 12 of the substrate 10 through photolithography. Exposure by the photolithography may utilize an exposure apparatus or an electron beam radiator. Instead of the photolithography, nanoimprinting may be used. The nanoimprinting type is not particularly limited, such as a heating type, a photo-curing type, or a roll-to-roll type. A selection ratio may become a problem in etching at a high aspect ratio using a photoresist as a mask. The etching mask for a structure may be a multilayer mask to obtain a higher selection ratio. A first structure 20 has a convex part 22 and a concave part 25. The first structure 20 may be the same material as the substrate 10: S110 may form a layer of the first structure 20 on the substrate 10, or may form a relief pattern by processing the substrate 10.

Next, a sacrifice layer 30 is applied (formed) onto the top surface 12 of the substrate 10 or onto the first structure 20 by spin coating (S120). While this embodiment uses the sacrifice layer 30 made of thermoplastic resin, its type is not limited. For example, the sacrifice layer 30 may be made of a material, such as a photoresist agent, bottom antireflection coating ("BARC"), acrylic resin, or polystyrene resin, another oxygen ashable material, or a metallic material, such as Al. The sacrifice layer 30 may be made of an oxide, such as $SiO_2$, which does not etch a structure, or a material that can be removed by a gas or liquid having a high selection ratio.

A thickness H of the sacrifice layer 30 needs to be higher than a height h of the first structure 20 in the Z direction. Thereby, the sacrifice layer 30 is formed such that the sacrifice layer 30 can be filled in the concave parts 25 of the first structure 20 and that the sacrifice layer 30 can completely cover surfaces 23 of the convex parts 22 of the first structure 20 on a side opposite to the substrate 10.

Figure 2B:
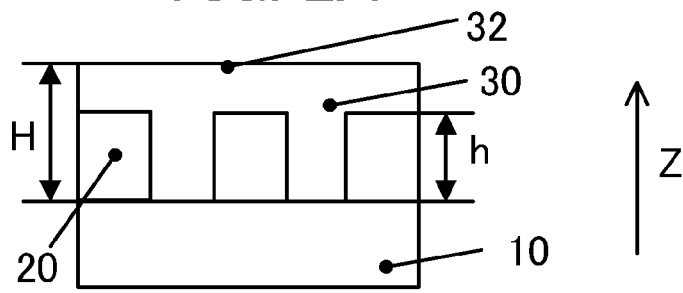

Next, the sacrifice layer 30 is cured (S130). This embodiment cures the sacrifice layer 30 through heating, but the curing type is not limited. FIG. 2B is a sectional view showing this state. The surface 32 of the sacrifice layer 30 is approximately flat due to the spin coating and the flatness is maintained. The formation of the sacrifice layer 30 is not limited to the spin coating, and may use another coating technology, such as a spray coating method or a slit coating method, or a dry process, CVD, vapor-deposition, or sputtering, or a plating method, such as damascene processing.

In order to improve the flatness of the surface 32 of the sacrifice layer 30, a larger thickness of the sacrifice layer 30 from the top surface 23 of the first structure 20 is effective. However, the larger thickness of the sacrifice layer 30 may destroy the structure in dropping the second structure 40. Therefore, a flat and thin sacrifice layer 30 may be effective.

Figure 2C:
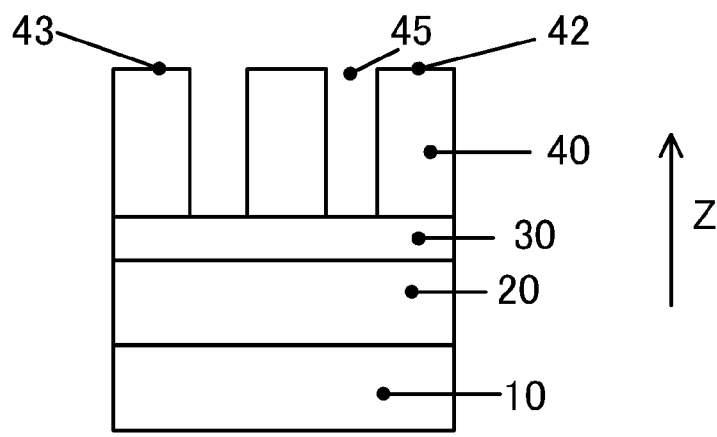

Next, a second structure 40 having a relief pattern is formed on the surface 32 of the sacrifice layer 30 (S140). FIG. 2C shows a sectional view showing this state, viewed from a direction orthogonal to FIG. 2A. This embodiment forms the second structure 40 on the top surface 32 of the sacrifice layer 30 through a general film formation technology, such as a vapor deposition method, a spattering method, or a CVD method. A process temperature needs to be controlled so as to avoid a deformation or degeneration of the sacrifice layer 30. The second structure 40 has a patterned direction orthogonal to that of the first structure 20, but this configuration is merely illustrative. The second structure 40 also has a convex part 42 and a concave part 45. A repetitive layer forming method is similar to the above patterning. It is necessary to continue etching until the sacrifice layer 30 exposes, but the sacrifice layer 30 serves as an etching stop layer and allows slightly excessive etching.

Figure 2D:
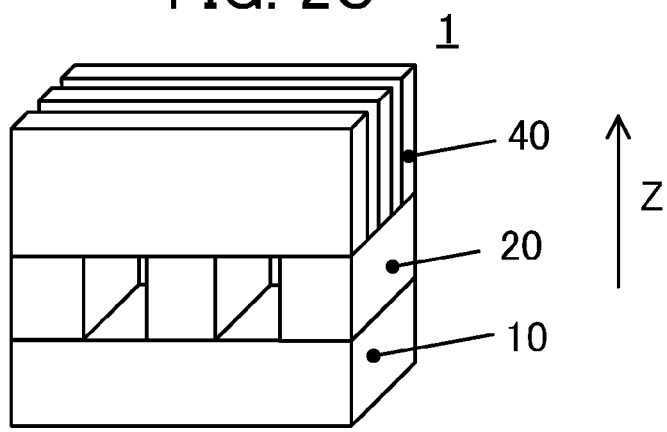

Next, the sacrifice layer 30 is removed (S150). This embodiment uses a dry process (plasma ashing), and as the pressure is lower than 10 Pa the anisotropy becomes so strong that the sacrifice layer 30 under the grating or outside of the pattern may not be completely removed. On the other hand, the pressure set to 10 Pa or higher maintains the isotropy and is suitable for a removal of the sacrifice layer. Thus, the pressure is maintained from 10 Pa to the atmospheric pressure at that time. The sacrifice layer 30 is completely removed by dry etching using a gas type that can remove only the sacrifice layer 30, whereby the second structure 40 is dropped on the first structure 20 to form a three-dimensional structure 1 in which the first structure 20 and the second structure 40 are layered. The gas may use oxygen, etc., but is not particularly limited, as long as a selection ratio between the structure and the sacrifice layer is high. The dry etching type is not particularly limited, and may use, for example, reactive ion etching ("RIE"), inductively coupled plasma ("ICP"), or neutral loop discharge ("NLD"). FIG. 2D is a perspective view showing this state.

The three-dimensional structure 1 can be a line and space (L&S) structure, a hole structure, a dot structure, or the like, and each layer may have one of the structures. When a plurality of structures are combined, for example, a structure in the first layer has a dot pattern and a structure in the second layer has a L&S, an optical element having a plurality of optical characteristics may be configured in one chip.

Instead of dry etching, wet etching may be used as long as it is a method of obtaining a predetermined structure without corroding the sacrifice layer. Alternatively, a supercritical process that uses a drug that dissolves only the sacrifice layer may be used.

U.S. Pat. No. 4,662,746 exposes the surface 23 of the first structure 20 by performing CMP between S130 and S140. Before the removal step S150, the second structure 40 contacts the first surface 23 of the convex part 22 of the first structure 20. The CMP may increase the cost, and deteriorate the in-plane uniformity because a polishing amount in polishing the top of the surface 23 of the convex part 22 differs from a polishing amount in polishing the top of the concave part 25. This embodiment performs no CMP, and will maintain the cost or the in-plane uniformity. In addition, as a result of that the removal step S150 removes the sacrifice layer 30 from between the first structure 20 and the second structure 40, the second structure 40 first contacts the surface 23 of the convex 22 of the first structure 20. Since S150 drops the second structure 40 on the first structure 20 precisely (or without a positional offset), no CMP is necessary.

The conventional wafer fusing method prepares two structures shown in FIG. 2A, and removes one substrate 10 after the first structures 20 are arranged opposite to each other, rotated by 90°, and fused. On the other hand, this embodiment does not remove the substrate 10, and will not increase the cost.

This embodiment can precisely and easily obtain the three-dimensional structure 1, provide simultaneous processing of a large area, and eliminate a time-consuming step, such as CMP, for efficient productivity.

Figure 3:
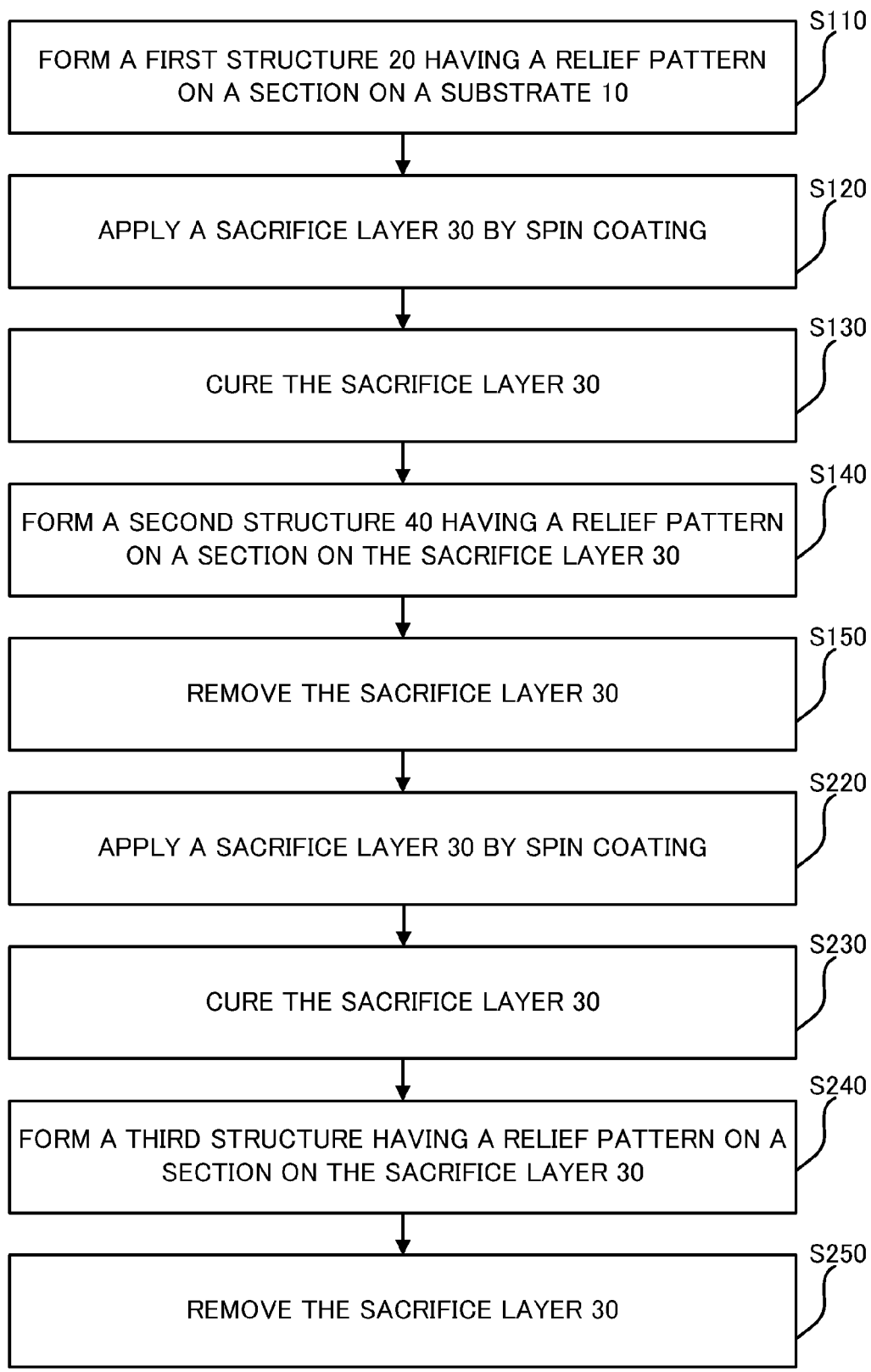
FIG. 3 is a flowchart for explaining a manufacturing method of a three-dimensional structure having three layers or more.

FIG. 3 is a flowchart for explaining a method for additionally layering a third structure on the second structure 40. S110 to S150 are similar to those of FIG. 1, and a description thereof will be omitted. FIG. 3 repeats S220 to S250 corresponding to S120 to S150 after the removal step S150. In other words, the sacrifice layer 30 is formed on the second structure 40 such that the sacrifice layer 30 can be filled in the concave parts 45 of the second structure 40 and the sacrifice layer 30 can completely cover the surfaces 43 of the convex parts 42 of the second structure 40 on the side opposite to the substrate 10 (S220). Next, the sacrifice layer 30 is cured (S230). Next, a third structure having a relief pattern is formed on the sacrifice layer 30 (S240). Next, the sacrifice layer 30 is removed (S250). When the removal step S250 removes the sacrifice layer 30 from between the second structure 40 and the third structure, the third structure contacts the surfaces 43 of the convex parts 42 of the second structure 40.

Figure 4:
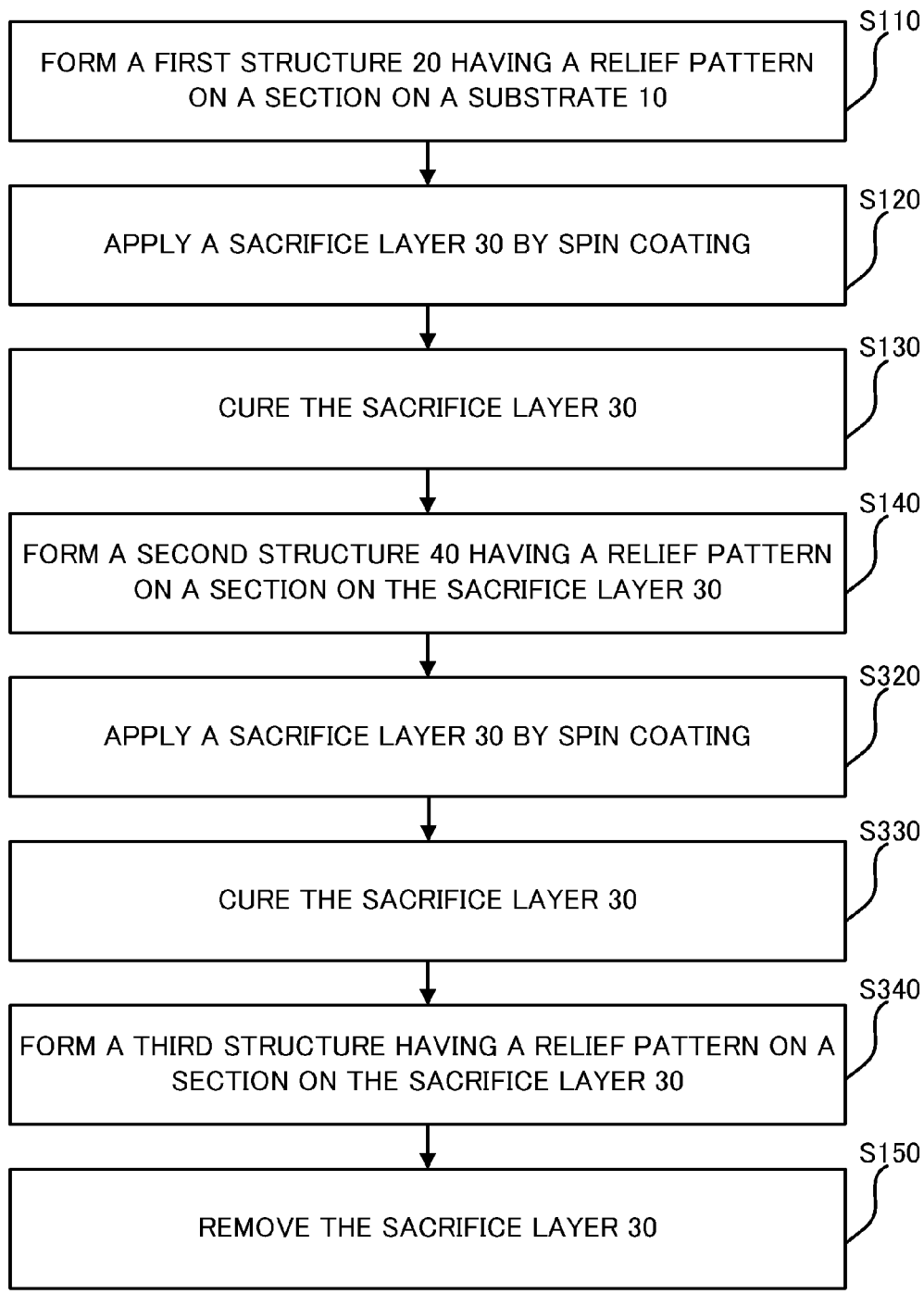
FIG. 4 is a flowchart for explaining another manufacturing method of a three-dimensional structure having three layers or more.
Figure 5A:
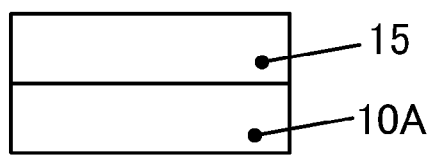
FIGS. 5A-5G are views of each step in a manufacturing method of a three-dimensional structure according to a first embodiment.
Figure 5B:
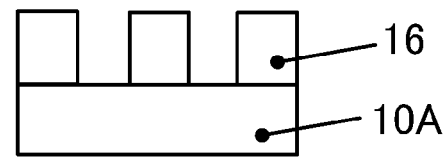
Figure 5C:
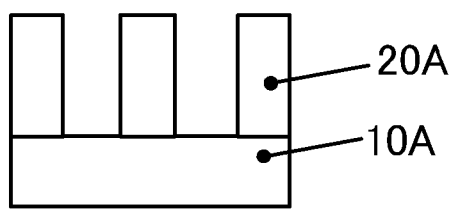
Figure 5D:
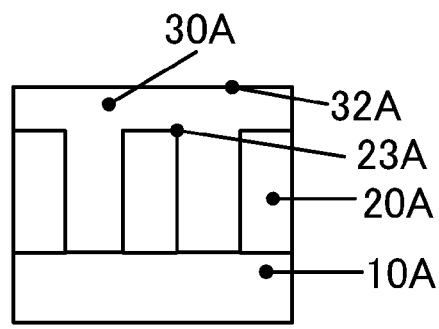
Figure 5E:
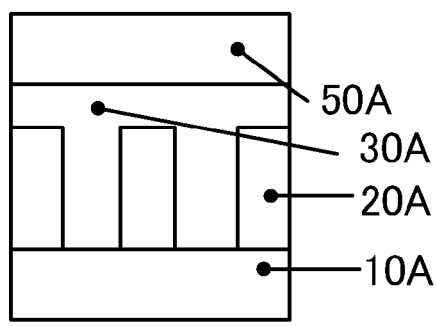
Figure 5F:
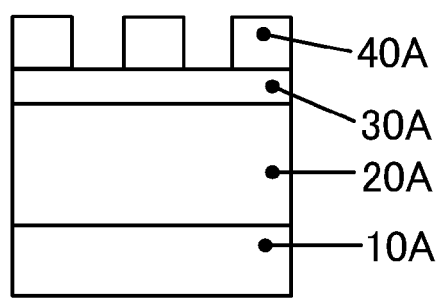
Figure 5G:
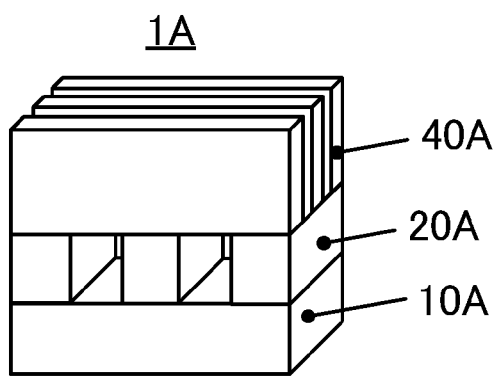

FIG. 4 is a flowchart for explaining a method different form FIG. 3. S110 to S150 are similar to those of FIG. 1, and a description thereof will be omitted. FIG. 4 repeats S320 to S340 corresponding to S120 to S140 between the step S140 for forming the second structure 40 and the removal step S150, and thereafter simultaneously removes the sacrifice layer 30. In other words, the sacrifice layer 30 is formed on the second structure 40 such that the sacrifice layer 30 can be filled in the concave parts 45 of the second structure 40 and the sacrifice layer 30 can completely cover the surfaces 43 of the convex parts 42 of the second structure 40 on the side opposite to the substrate 10 (S320). Next, the sacrifice layer 30 is cured (S330). Next, a third structure having a relief pattern is formed on the sacrifice layer 30 (S340). Next, S150 simultaneously removes a plurality of sacrifice layers 30. This method forms n layers (n>=2) in which the sacrifice layer 30 is held between two adjacent layers. Since FIG. 4 simultaneously removes a plurality of sacrifice layers 30, a drop amount of the structure is large and an alignment may destroy. It is thus effective to combine the method shown in FIG. 3 for a finer structure.

The method shown in FIG. 3 can be combined with the method shown in FIG. 4. The removal step S150 simultaneously removes a plurality of sacrifice layers in layering a structure of a plurality of first layers of the three-dimensional structure, and the removal step S150 removes the sacrifice layers one by one in layering a structure of a plurality of second layers more fragile than the structure of a plurality of first layers. The structure of the plurality of second layers is, for example, a pattern having a high aspect ratio, or a pattern of a pillar shape.

First Embodiment

FIGS. 5A-5G are views for explaining a manufacturing method of a three-dimensional structure 1A according to a first embodiment.

A description will now be given of patterning of a first layer. A photolithography process for patterning of an 8-inch quartz wafer substrate 10A was performed. Fuji Film GKR-5201 was used to pattern a photoresist 15. The photoresist 15 was coated so as to obtain a thickness of 200 nm by a spin coat method (see FIG. 5A).

Next followed an exposure with Canon semiconductor exposure machine FPA-6000ES6a. An exposure pattern was an L&S of 75 nm in a square area of 25 mm. Next, it was immersed in a TMAH (Tetramethylammonium hydroxide) development solution for one minute and then rinsed with pure water: Thereby, a line pattern 16 of a photoresist 15 was obtained (see FIG. 5B).

Next, the quartz wafer substrate 10A was etched by using a plane-parallel plate type RIE apparatus with an etching gas of $CHF_3$, a pressure of 2 Pa, and an RF power of 70 W for 20 minutes. Moreover, an ashing unit was used to remove a residual resist, and a grating shape 20A was obtained with a grating step 250 nm (see FIG. 5C).

Next, the sacrifice layer 30A was embedded by spin coating at 3,885 rpm by using Nissan Chemical Industries DUV-42. This process was repeated for embedding four times (see FIG. 5D), and consequently provided a flat surface 32A of the sacrifice layer 30A 80 nm above the top surface 23A of the quartz grating pattern.

Next follows patterning of a second layer. For the patterning of the second layer, a titanium oxide film was formed on the substrate with a thickness of 70 nm by a sputtering method. As a result, a continuous and uniform titanium oxide layer 50A having a sufficiently flat surface could be obtained (see FIG. 5E).

Next follows a photolithography process for patterning of the titanium oxide layer 50A. A titanium oxide layer was exposed with the same condition as patterning of the quartz wafer. Next, the titanium oxide layer 50A was etched for seven minutes similar to the quartz wafer substrate 10A. A titanium oxide grating pattern 40A was formed with a grating step of 70 nm (see FIG. 5F). At this time, the resist remained with a grating shape.

Next, the sacrifice layer 30A and the residual resist were ashed. The sacrifice layer 30A was ashed with an oxygen gas using an ashing unit for two minutes. A hollow structure was obtained by removing the sacrifice layer 30A embedded in the grating in the first layer, and by dropping the second layer onto the first layer, and (see FIG. 5G). Thus, the three-dimensional structure 1A having two layers was obtained. When the pattern was severed and the section was observed with a FE-SEM, a three-dimensional structure was confirmed.

Second Embodiment

Similar to the first embodiment, a second embodiment used an 8-inch quartz wafer substrate 10B. FIGS. 6A-6G are views for explaining a manufacturing method of a three-dimensional structure 1B according to a second embodiment.

A description will now be given of patterning of a first layer. A titanium oxide film 52B having a thickness of 300 nm was formed on the 8-inch quartz wafer substrate 10B by a sputtering method. Thereby, a layer used to form a structure of the first layer was obtained (see FIG. 6A).

Next followed a photolithography process for patterning the titanium oxide layer 52B by using Fuji Film GKR-5201 for a photoresist for the patterning. The photoresist was applied so as to obtain a thickness of 200 nm by a spin coating method. Next followed an exposure of an L&S of 75 nm in a square area of 25 mm using Canon semiconductor exposure machine FPA-6000ES6a.

Next, it was immersed in a TMAH development solution for one minute and then rinsed with pure water: Thereby, a photoresist line pattern 54B was obtained (see FIG. 6B). Next, a titanium oxide layer was etched by using a plane-parallel plate type RIE apparatus with an etching gas of $CHF_3$, a pressure of 2 Pa, an RF power of 70 W for 30 minutes. An ashing unit was used to remove a residual resist, and a grating shape 20B having a grating step 300 nm was obtained (see FIG. 6C).

Figure 6A:
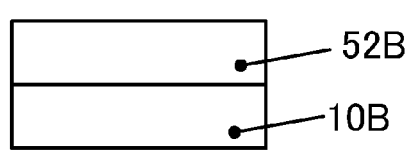
FIGS. 6A-6G are views of each step in a manufacturing method of a three-dimensional structure according to a second embodiment.
Figure 6B:
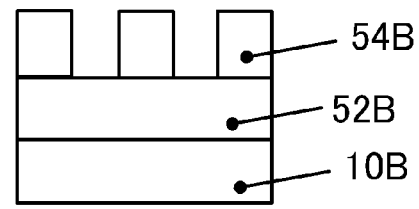
Figure 6C:
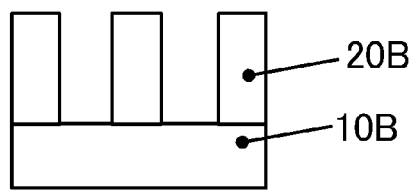
Figure 6D:
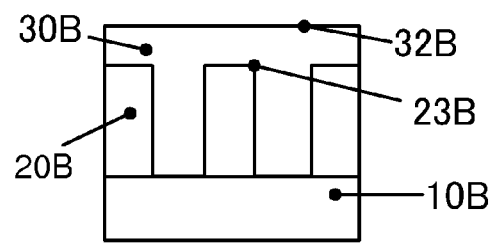
Figure 6E:
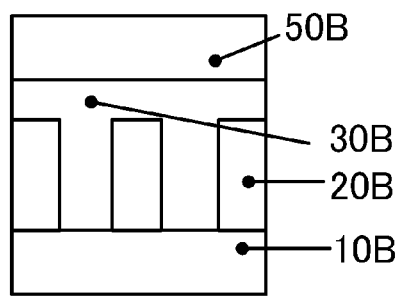

Next, the sacrifice layer 30B was embedded by repeating spin coating four times at 3,885 rpm by using Nissan Chemical Industries DUV-42 (see FIG. 6D). As a result, the sacrifice layer 30B had a flat surface 32B 80 nm above the top surface 23B of the titanium oxide grating pattern.

Next follows a description of patterning of a second layer. For the patterning of the second layer, a silicon dioxide film was formed on a substrate with a thickness of 70 nm by a sputtering method. As a result, a continuous and uniform silicon dioxide layer 50B having a sufficiently flat surface could be obtained (see FIG. 6E). Next followed a photolithography process for patterning of the silicon dioxide layer 50B. The silicon dioxide layer 50B was exposed with the same condition as patterning of the titanium oxide layer.

Figure 6F:
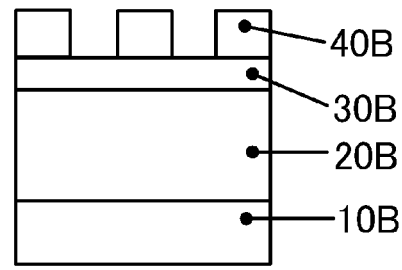
Figure 6G:
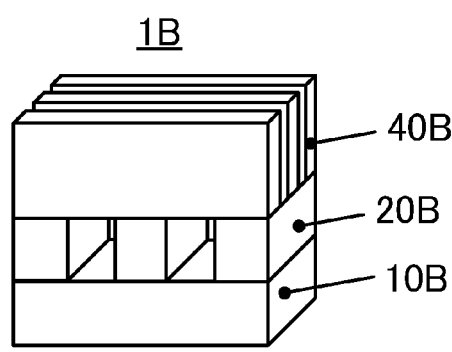

Next, the silicon dioxide layer was etched for five minutes similar to the titanium oxide layer, and a silicon dioxide grating pattern 40B having a grating step of 70 nm was obtained (see FIG. 6F). At this time, the resist remained with a grating shape.

Next, the sacrifice layer 30B and the residual resist were ashed. The sacrifice layer 30B was ashed with an oxygen gas using an ashing unit for two minutes. A hollow structure was obtained by removing the sacrifice layer 30B embedded in the grating in the first layer, and by dropping the second layer onto the first layer (see FIG. 6G).

Thus, the three-dimensional structure 1B having two layers was obtained. When the pattern was severed and the section was observed with a FE-SEM, a three-dimensional structure was confirmed.

Third Embodiment

A third embodiment used an 8-inch quartz wafer substrate 10C, similar to the first embodiment and the second embodiment. FIGS. 7A-7G are views for explaining a manufacturing method of a three-dimensional structure 1C according to a third embodiment.

A description will now be given of patterning of a first layer. A titanium oxide layer 52C having a thickness of 280 nm was formed on the 8-inch quartz wafer substrate 10C by a sputtering method. Thereby, a layer used to form a structure of a first layer was obtained (see FIG. 7A).

Next followed a photolithography process for patterning a titanium oxide layer by using Fuji Film GKR-5201 for a photoresist for the patterning. The photoresist was applied so as to obtain a thickness of 200 nm by a spin coating method. Next followed an exposure of an L&S of 75 nm in a square area of 25 mm using Canon semiconductor exposure machine FPA-6000ES6a.

Next, it was immersed in a TMAH development solution for one minute and then rinsed with pure water: Thereby, a photoresist line pattern 54C was obtained (see FIG. 7B). Next, a titanium oxide layer was etched by using an NLD apparatus with an etching gas of $C_3F_8$, a pressure of 1 Pa, and a bias power of 200 W for one minute. An ashing unit was used to remove a residual resist, and a grating shape 20C having a grating step 280 nm was obtained (see FIG. 7C).

Figure 7A:
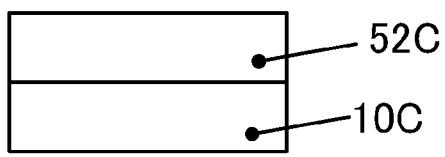
FIGS. 7A-7G are views of each step in a manufacturing method of a three-dimensional structure according to a third embodiment.
Figure 7B:
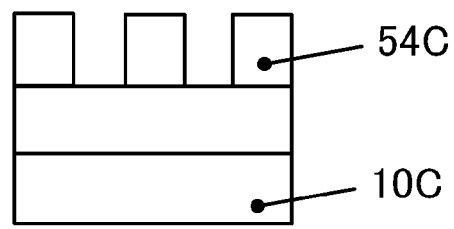
Figure 7C:
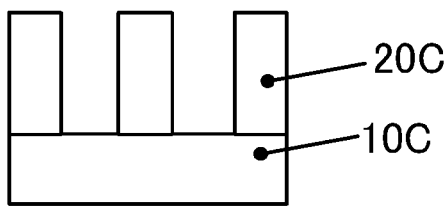
Figure 7D:
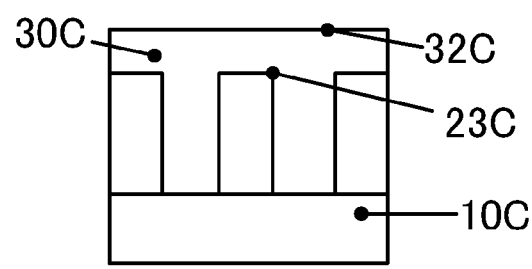
Figure 7E:
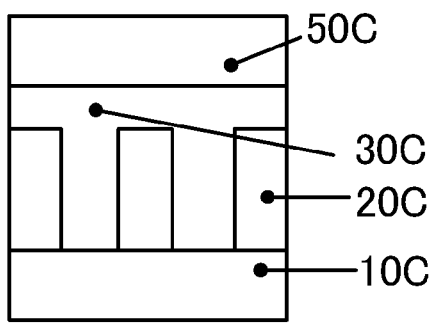

Next, the sacrifice layer 30C was embedded by repeating spin coating four times at 3,885 rpm by using Nissan Chemical Industries DUV-42 (see FIG. 7D). As a result, the sacrifice layer 30C had a flat surface 32C 100 nm above the top surface 23C of the titanium oxide grating pattern.

Next follows a description of patterning of a second layer. For the patterning of the second layer, a titanium oxide film was formed on the substrate with a thickness of 70 nm by a sputtering method. As a result, a continuous and uniform titanium oxide layer 50C having a sufficiently flat surface could be obtained (see FIG. 7E). Next followed a photolithography process for patterning of the titanium oxide layer 50C. The titanium oxide layer 50C was also exposed with the same condition as that of patterning of the titanium oxide layer of the first layer.

Figure 7F:
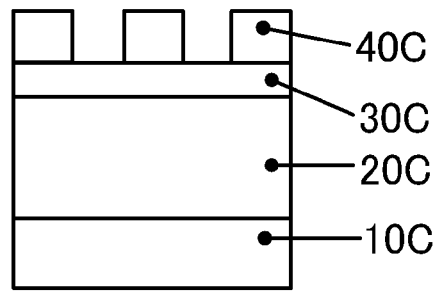
Figure 7G:
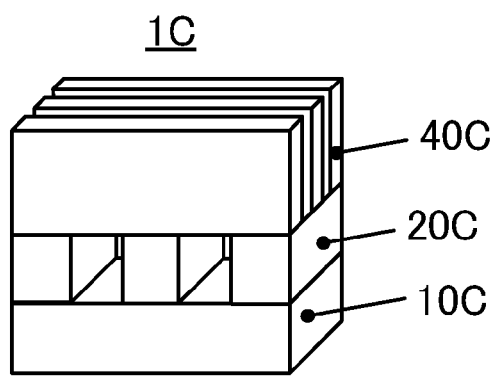

Next, the titanium oxide layer of the second layer was etched for 0.4 minutes similar to the first layer, and a titanium oxide grating pattern 40C having a grating step of 70 nm was obtained (see FIG. 7F). At this time, the resist remained with a grating shape.

Next, the sacrifice layer 30C and the residual resist were ashed. The sacrifice layer 30C was ashed with an oxygen gas using an ashing unit for two minutes. The sacrifice layer 30C embedded in the grating in the first layer was removed, the second layer was dropped on the first layer, and a hollow structure was obtained (see FIG. 7G).

As described above, the three-dimensional structure 1C having two layers was obtained. When the pattern was severed and the section was observed with a FE-SEM, a three-dimensional structure was confirmed.

Fourth Embodiment

The fourth embodiment used an 8-inch silicon wafer substrate 10D. FIGS. 8A-8H are views for explaining a manufacturing method of a three-dimensional structure 1D according to a fourth embodiment.

A description will now be given of patterning of a first layer. An aluminum film 52D of 100 nm is formed on the 8-inch silicon wafer substrate 10D by a sputtering method. Thereby, a layer used to form a structure of the first layer is obtained (see FIG. 8A).

Next followed a photolithography process for patterning the aluminum layer by using Fuji Film GKR-5201 for a photoresist for the patterning. The photoresist was applied so as to obtain a thickness of 200 nm by a spin coating method. Next followed an exposure of an L&S of 75 nm in a square area of 10 mm using Canon semiconductor exposure machine FPA-6000ES6a.

Next, it was immersed in a TMAH development solution for one minute and then rinsed with pure water: Thereby, a photoresist line pattern 54D was obtained (see FIG. 8B). Next, the aluminum layer was etched by using an NLD apparatus with an etching gas of $Cl_2$, a pressure of 0.5 Pa, and a bias power of 200 W for 20 seconds. An ashing unit was used to remove a residual resist, and a grating shape 20D having a grating step 100 nm was obtained (see FIG. 8C).

Figure 8A:
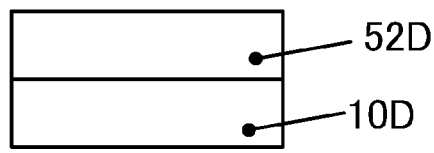
FIGS. 8A-8H are views of each step in a manufacturing method of a three-dimensional structure according to a fourth embodiment.
Figure 8B:
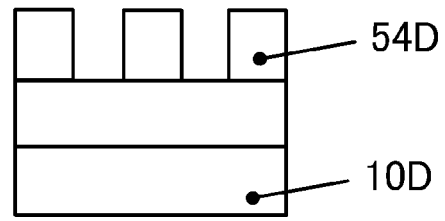
Figure 8C:
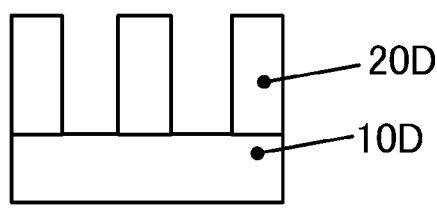
Figure 8D:
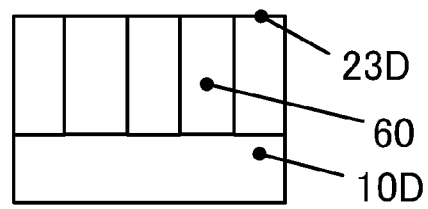
Figure 8E:
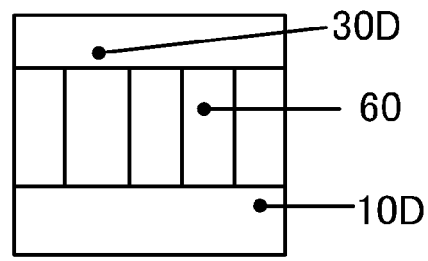
Figure 8F:
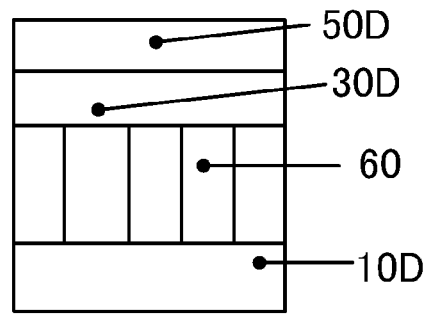
Figure 8G:
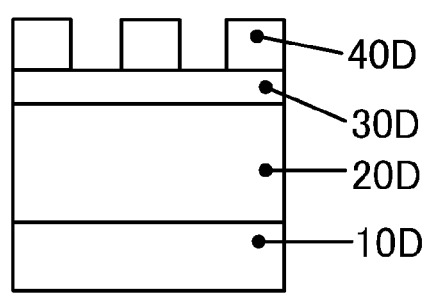
Figure 8H:
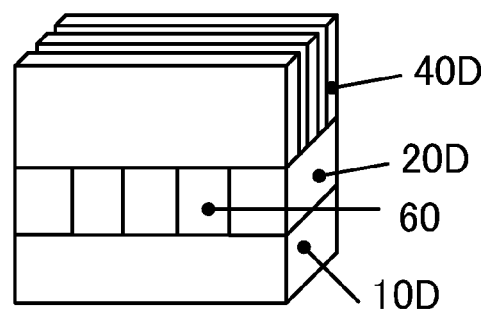

Next, an aluminum grating was embedded with an ozone-TEOS method among the gratings, and a TEOS film 60 was polished by a CMP method so that the top surface 23D of the aluminum grating pattern can expose to the surface (FIG. 8D). Next, a sacrifice layer 30D is embedded with 50 nm by using Nissan Chemical Industries DUV-42 at 3,885 rpm through spin coating (see FIG. 8E).

Next follows a description of patterning of a second layer. For the patterning of the second layer, a silicon film was formed on the substrate with a thickness of 70 nm by a sputtering method. As a result, a continuous and uniform silicon layer 50D having a sufficiently flat surface could be obtained (see FIG. 8F). Next followed a photolithography process for patterning of the silicon layer 50D. The silicon layer 50D was exposed with the same condition as that of patterning of the aluminum layer. A critical dimension was 500 nm of a L&S, and a grating direction was a direction orthogonal to the first layer.

Next, the silicon layer 50D was etched for five minutes by using a plane-parallel plate type RIE with an etching gas of $SF_6$, a pressure of 2 Pa, and an RF power of 70 W. A silicon grating pattern 40D having a grating step of 70 nm was obtained (see FIG. 8G). At this time, the resist remained with a grating shape.

Next, the sacrifice layer 30D and the residual resist were ashed. The sacrifice layer 30D was ashed with an oxygen gas using an ashing unit for two minutes. A three-dimensional structure was obtained by removing the sacrifice layer 30D embedded in the grating in the first layer, and by dropping the second layer onto the first layer (see FIG. 8H).

Thus, the three-dimensional structure 1D having two layers was obtained. This technology is applicable to a three-dimensional electronic circuit, such as a semiconductor. Even when a positional shift occurs in overlay exposures subsequent to the second layer, the sacrifice layer prevents damages of the lower layer which would occur during etching.

Each embodiment can form a newer layer on the uppermost layer without depending on the fill factor of a material and a structure, and easily form a three-dimensional structure having multilayer structures and apertures. Since this three-dimensional structure can be precisely controlled through a photolithography process and thus configured as a ultra fine structure, it is applicable not only to a mechanical element, such as a MEMS, but also to an application of an optical element, such as a lens, diffraction optical element, a polarization beam splitter ("PBS"), and photonic crystal, which has many layers of a material each having a different shape, refractive index, and thickness.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-150482, filed Jun. 9, 2008, which is hereby incorporated by reference herein in its entirety.

What is claimed is:

1. A method of manufacturing a three-dimensional structure, the method comprising:
   a first step of forming a first structure having a relief pattern on a substrate;
   a second step of forming a sacrifice layer on the first structure such that the sacrifice layer can be filled in a concave part of the first structure and the sacrifice layer can cover a surface of a convex part of the first structure on a side opposite to the substrate;

a third step of forming a second structure having a relief pattern on the sacrifice layer; and a fourth step of removing the sacrifice layer from between the first structure and the second structure to bring the second structure into contact with the surface of the first structure.

2. The method according to claim 1, wherein the first step forms a layer of the first structure on the substrate.

3. The method according to claim 1, wherein the first step forms the first structure through photolithography or imprinting.

4. The method according to claim 1, further comprising the steps of:

forming, after the fourth step, the sacrifice layer on the second structure such that the sacrifice layer can be filled in a concave part of the second structure and the sacrifice layer can cover a surface of a convex part of the second structure on a side opposite to the substrate;

forming a third structure having a relief pattern on the sacrifice layer; and removing the sacrifice layer from between the second structure and the third structure to bring the third structure into contact with the surface of the second structure.

5. The method according to claim 1, further comprising, between the third step and the fourth step:

forming the sacrifice layer on the second structure such that the sacrifice layer can be filled in a concave part of the second structure and the sacrifice layer can cover a surface of a convex part of the second structure on a side opposite to the substrate; and forming a third structure having a relief pattern on the sacrifice layer, wherein the fourth step simultaneously removes a plurality of the sacrifice layers.

6. The method according to claim 1, wherein the fourth step uses a dry process with a pressure set to 10 Pa or higher.

* * * * *